(12) United States Patent
Kim et al.

(10) Patent No.: US 11,482,151 B2
(45) Date of Patent: Oct. 25, 2022

(54) STAGE CIRCUIT AND A SCAN DRIVER INCLUDING THE SAME

(71) Applicant: SAMSUNG DISPLAY CO., LTD., Yongin-si (KR)

(72) Inventors: Na Young Kim, Yongin-si (KR); Dong Hwi Kim, Yongin-si (KR); Jin Jeon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/647,278

(22) Filed: Jan. 6, 2022

(65) Prior Publication Data

US 2022/0130313 A1 Apr. 28, 2022

Related U.S. Application Data

(63) Continuation of application No. 17/197,816, filed on Mar. 10, 2021, now Pat. No. 11,222,573, which is a (Continued)

(30) Foreign Application Priority Data

Mar. 10, 2020 (KR) .......................... 10-2020-0029817

(51) Int. Cl.
*G09G 3/20* (2006.01)

(52) U.S. Cl.
CPC ....... *G09G 3/20* (2013.01); *G09G 2300/0426* (2013.01); *G09G 2300/08* (2013.01);
(Continued)

(58) Field of Classification Search
CPC ................ G09G 3/20; G09G 2300/08; G09G 2300/0426; G09G 2310/0202;
(Continued)

(56) References Cited

U.S. PATENT DOCUMENTS 10,950,157 B1 3/2021 Kim et al.
2017/0221578 A1\* 8/2017 Xiao .................... G09G 3/2092
(Continued)

FOREIGN PATENT DOCUMENTS

KR 10-2018-0125670 11/2018
KR 10-2019-0063624 6/2019
(Continued)

*Primary Examiner* — Andrew Sasinowski
(74) *Attorney, Agent, or Firm* — F. Chau & Associates, LLC

(57) ABSTRACT

A stage circuit including: a first sub-stage circuit coupled to a first input terminal receiving an input signal, a second input terminal receiving a first clock signal, and a third input terminal receiving a second clock signal, the first sub-stage circuit controlling a voltage of a first node, a second node, and a third node based on the input signal and the first and second clock signals, and supplying a first scan signal to a first output terminal based on the voltage of the second and third nodes; and a second sub-stage circuit coupled to the second input terminal, a fourth input terminal receiving a third clock signal, and the first and second nodes, the second sub-stage circuit supplying a second scan signal to a second output terminal based on the first and third clock signal, and the voltage of the first and second nodes.

12 Claims, 7 Drawing Sheets

Related U.S. Application Data continuation of application No. 17/034,855, filed on Sep. 28, 2020, now Pat. No. 10,950,157.

(52) U.S. Cl.
CPC ............. *G09G 2310/0202* (2013.01); *G09G 2310/027* (2013.01); *G09G 2310/0267* (2013.01); *G09G 2310/08* (2013.01); *G09G 2330/02* (2013.01)

(58) Field of Classification Search
CPC ......... G09G 2310/027; G09G 2330/02; G09G 2310/0267; G09G 2310/08
See application file for complete search history.

(56) References Cited

U.S. PATENT DOCUMENTS

| | | | | |
|---|---|---|---|---|
| 2017/0309345 | A1* | 10/2017 | Umezaki | G09G 3/3677 |
| 2018/0197483 | A1* | 7/2018 | Tanikame | G09G 5/001 |
| 2018/0330673 | A1 | 11/2018 | Kang et al. | |
| 2019/0013083 | A1* | 1/2019 | Wang | G09G 3/3266 |
| 2019/0066604 | A1* | 2/2019 | Kong | G09G 3/3266 |
| 2019/0130807 | A1* | 5/2019 | Wu | G09G 3/3674 |
| 2019/0130842 | A1* | 5/2019 | Jang | G09G 3/3266 |
| 2019/0164498 | A1 | 5/2019 | Jang | |
| 2020/0105202 | A1* | 4/2020 | Yuan | G09G 3/3258 |
| 2020/0175913 | A1 | 6/2020 | Kang et al. | |
| 2020/0243018 | A1* | 7/2020 | Kim | G09G 3/3677 |
| 2021/0287585 | A1 | 9/2021 | Kim et al. | |

FOREIGN PATENT DOCUMENTS

| | | |
|---|---|---|
| KR | 10-2019-0070040 | 6/2019 |
| KR | 10-2020-0066482 | 6/2020 |

\* cited by examiner

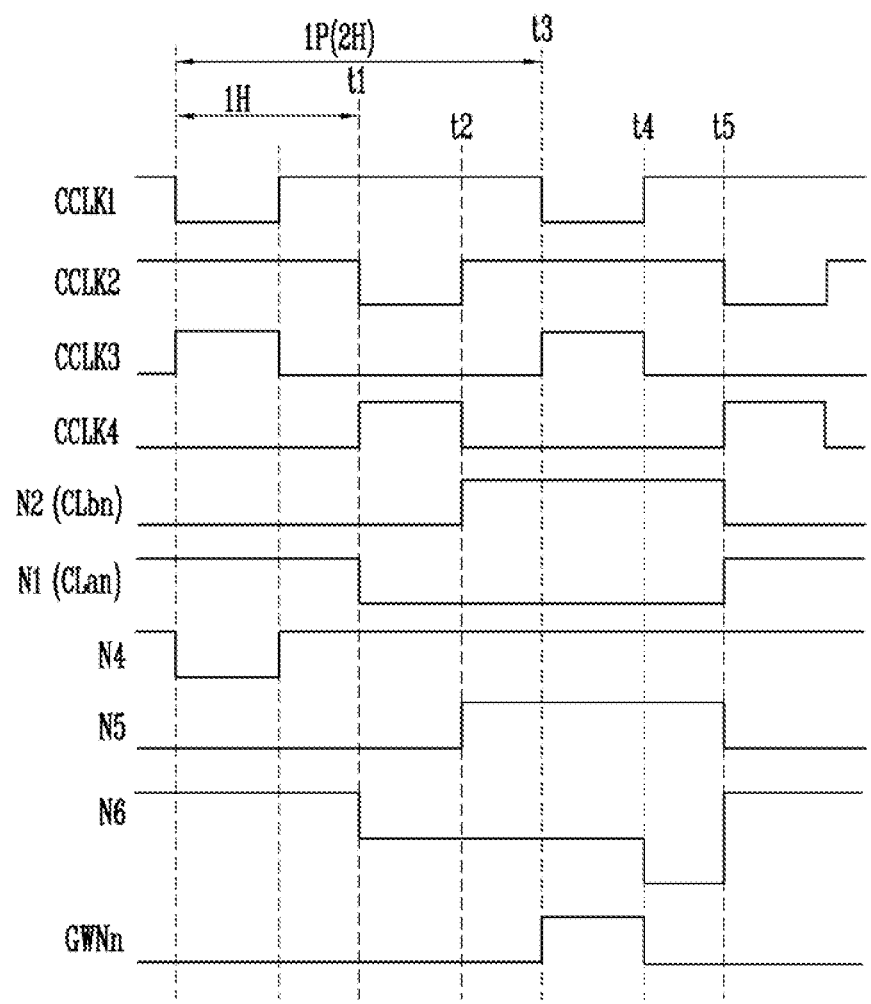

STAGE CIRCUIT AND A SCAN DRIVER INCLUDING THE SAME

CROSS-REFERENCE TO RELATED APPLICATIONS

The present application is a continuation of U.S. patent application Ser. No. 17/197,816 filed on Mar. 10, 2021, which is a continuation of U.S. patent application Ser. No. 17/034,855 filed on Sep. 28, 2020, now U.S. Pat. No. 10,950,157 issued on Mar. 16, 2021, which claims priority under 35 U.S.C. 119 to Korean patent application number no. 10-2020-0029817, filed on Mar. 10, 2020, the disclosures of which are incorporated by reference herein in their entireties.

TECHNICAL FIELD

Exemplary embodiments of the present inventive concept relate to a stage circuit and a scan driver including the stage circuit.

DESCRIPTION OF RELATED ART

A display device includes an array of pixels to display an image. Pixels included in a display device may be implemented using N-type metal-oxide-semiconductor (NMOS) transistors and P-type metal-oxide-semiconductor (PMOS) transistors to minimize leakage current. For example, each of the NMOS and PMOS transistors included in the pixels may be driven by a scan signal. In this case, a scan driver may supply a scan signal having a high level to the pixels in response to an activated NMOS transistor, and supply a scan signal having a low level to the pixels in response to an activated PMOS transistor.

SUMMARY

An exemplary embodiment of the present inventive concept may provide a stage circuit including: a first sub-stage circuit coupled to a first input terminal to which an input signal is supplied, a second input terminal to which a first clock signal is supplied, and a third input terminal to which a second clock signal is supplied, wherein the first sub-stage circuit is configured to control a voltage of a first node, a voltage of a second node, and a voltage of a third node based on the input signal, the first clock signal, and the second clock signal, and supply a first scan signal to a first output terminal based on the voltage of the second node and the voltage of the third node; and a second sub-stage circuit coupled to the second input terminal, a fourth input terminal to which a third clock signal is supplied, the first node, and the second node, wherein the second sub-stage circuit is configured to supply a second scan signal different from the first scan signal to a second output terminal based on the first clock signal, the third clock signal, the voltage of the first node, and the voltage of the second node.

The first scan signal may include a low level pulse, and the second scan signal may include a high level pulse.

The first sub-stage may output the low level pulse of the first scan signal based on the voltage of the first node, and output the first scan signal at a high level based on the voltage of the second node, and the second sub-stage may output the high level pulse of the second scan signal based on the voltage of the first node, and output the second scan signal at a low level based on the voltage of the second node.

Each of the first sub-stage circuit and the second sub-stage circuit may include: a first power supply input terminal configured to receive a first power supply having a gate-off voltage; and a second power supply input terminal configured to receive a second power supply having a gate-on voltage.

The first sub-stage circuit may include: a first driver coupled with the first input terminal, the second input terminal, the third input terminal, and the first power supply input terminal, wherein the first driver is configured to control the voltage of the first node based on the input signal, the first clock signal, the second clock signal, and the first power supply; a second driver coupled with the third input terminal, the first power supply input terminal, the second power supply input terminal, and the first node, wherein the second driver is configured to control the voltage of the second node and the voltage of the third node based on the voltage of the first node, the second clock signal, and the second power supply; and a first output component coupled with the second input terminal, the first power supply input terminal, the second node, and the third node, wherein the first output component is configured to supply the first scan signal to the first output terminal based on the voltage of the first node, the voltage of the second node, the first power supply, and the first clock signal.

The first driver may include: a first transistor including a first electrode coupled to the first input terminal, a second electrode coupled to the first node, and a gate electrode coupled to the third input terminal; a second transistor including a first electrode coupled to the first node, and a gate electrode coupled to the second input terminal; and a third transistor including a first electrode coupled to the first power supply input terminal, a second electrode coupled to a second electrode of the second transistor, and a gate electrode coupled to the second node.

The first transistor may include: a first sub-transistor including a first electrode coupled to the first input terminal, and a gate electrode coupled to the third input terminal; and a second sub-transistor including a first electrode coupled to a second electrode of the first sub-transistor, a second electrode coupled to the first node, and a gate electrode coupled to the third input terminal.

The first output component may include: a fourth transistor including a first electrode coupled to the first power supply input terminal, a second electrode coupled to the first output terminal, and a gate electrode coupled to the second node; and a fifth transistor including a first electrode coupled to the second input terminal, a second electrode coupled to the first output terminal, and a gate electrode coupled to the third node.

The first output component may further include a first capacitor connected between the third node, and the first output terminal.

The second driver may include: a sixth transistor including a first electrode coupled to the first node, a second electrode coupled to the third node, and a gate electrode coupled to the second power supply input terminal; a seventh transistor including a first electrode coupled to the third input terminal, a second electrode coupled to the second node, and a gate electrode coupled to the first node; an eighth transistor including a first electrode coupled to the second power supply input terminal, a second electrode coupled to the second node, and a gate electrode coupled to the third input terminal; and a second capacitor connected between the first power supply input terminal, and the second node.

The second sub-stage circuit may include: a third driver coupled with the second input terminal, the first power supply input terminal, the second power supply input terminal, the first node, and the second node, wherein the third driver is configured to control a voltage of a fourth node, a voltage of a fifth node, and a voltage of a sixth node based on the voltage of the first node, the voltage of the second node, the first clock signal, the first power supply, and the second power supply; and a second output component coupled with the fourth input terminal, the second power supply input terminal, the fifth node, and the sixth node, wherein the second output component is configured to supply the second scan signal to the second output terminal based on the voltage of the fifth node, the voltage of the sixth node, the second power supply, and the third clock signal.

The third driver may include: a ninth transistor including a first electrode coupled to the second node, a second electrode coupled to the fifth node, and a gate electrode coupled to the second power supply input terminal; and a tenth transistor including a first electrode coupled to the first node, a second electrode coupled to the sixth node, and a gate electrode coupled to the second power supply input terminal.

The third driver may further include: an eleventh transistor including a first electrode coupled to the second input terminal, a second electrode coupled to the fourth node, and a gate electrode coupled to the fifth node; a twelfth transistor including a first electrode coupled to the first power supply input terminal, a second electrode coupled to the fourth node, and a gate electrode coupled to the first node; and a third capacitor connected between the fifth node, and the fourth node.

The second output component may include: a thirteenth transistor including a first electrode coupled to the second power supply input terminal, a second electrode coupled to the second output terminal, and a gate electrode coupled to the fifth node; a fourteenth transistor including a first electrode coupled to the fourth input terminal, a second electrode coupled to the second output terminal, and a gate electrode coupled to the sixth node; and a fourth capacitor connected between the sixth node, and the second output terminal.

The first clock signal, the second clock signal, the third clock signal, and the fourth clock signal may have an identical cycle, wherein the second clock signal may be delayed with a phase difference of a ½ cycle with respect to the first clock signal, the third clock signal may be an inverted version of the first clock signal, and the fourth clock signal may be an inverted version of the second clock signal.

The input signal may be a scan start signal or a first scan signal of a first sub-stage circuit of a previous stage.

An exemplary embodiment of the present inventive concept may provide a scan driver including a plurality of stage circuits configured to supply a first scan signal including a low level pulse to first scan lines and supply a second scan signal including a high level pulse to second scan lines, wherein at least one of the plurality of stage circuits includes: a first sub-stage circuit configured to receive an input signal through an input line, receive a first clock signal through a first clock line, receive a second clock signal through a second clock line, control a voltage of a first node, a voltage of a second node, and a voltage of a third node based on the input signal, the first clock signal, the second clock signal, and supply the first scan signal to a corresponding first scan line among the first scan lines based on the voltage of the second node and the voltage of the third node; and a second sub-stage circuit coupled to the first node and the second node and configured to receive the first clock signal through the first clock line, receive a third clock signal through the third clock line, supply the second scan signal to a corresponding second scan line among the second scan lines based on the first clock signal, the third clock signal, the voltage of the first node, and the voltage of the second node.

Each of the first sub-stage circuit and the second sub-stage circuit may be coupled to a first power supply configured to supply a gate-off voltage and a second power supply configured to supply a gate-on voltage.

The first sub-stage circuit may include: a first driver coupled with the input terminal, the first clock line, the second clock line, and the first power supply, wherein the first driver is configured to control the voltage of the first node based on the input signal, the first clock signal, the second clock signal, and a voltage of the first power supply; a second driver coupled with the second clock line, the first power supply, the second power supply, and the first node, wherein the second driver is configured to control the voltage of the second node and the voltage of the third node based on the voltage of the first node, the second clock signal, and a voltage of the second power supply; and a first output component coupled with the first clock line, the first power supply, the second node, and the third node, wherein the first output component is configured to supply the first scan signal to the first scan line based on the voltage of the first node, the voltage of the second node, the voltage of the first power supply, and the first clock signal.

The second sub-stage circuit may include: a third driver coupled with the first clock line, the first power supply, the second power supply, the first node, and the second node, wherein the third driver is configured to control a voltage of a fourth node, a voltage of a fifth node, and a voltage of a sixth node based on the voltage of the first node, the voltage of the second node, the first clock signal, the voltage of the first power supply, and the voltage of the second power supply; and a second output component coupled with the third clock line, the second power supply, the fifth node, and the sixth node, wherein the second output component is configured to supply the second scan signal to the second scan line in response to the voltage of the fifth node, the voltage of the sixth node, the voltage of the second power supply, and the third clock signal.

An exemplary embodiment of the present inventive concept may provide a first circuit configured to receive an input signal, a first clock signal and second clock signal, control a voltage of a first node, a voltage of a second node, and a voltage of a third node based on the input signal, the first clock signal, and the second clock signal, and supply a first scan signal to a first output terminal based on the voltage of the second node and the voltage of the third node; and a second circuit connected to the first node and the second node and configured to receive a third clock signal and supply a second scan signal different from the first scan signal to a second output terminal based on the first clock signal, the third clock signal, the voltage of the first node, and the voltage of the second node.

The second circuit may be directly connected to the first node and the second node.

BRIEF DESCRIPTION OF THE DRAWINGS

FIGS. 6 and 7 are waveform diagrams for describing an operation of the stage circuit of FIG. 5 according to an exemplary embodiment of the present inventive concept.

DETAILED DESCRIPTION OF THE EMBODIMENTS

Figure 1:
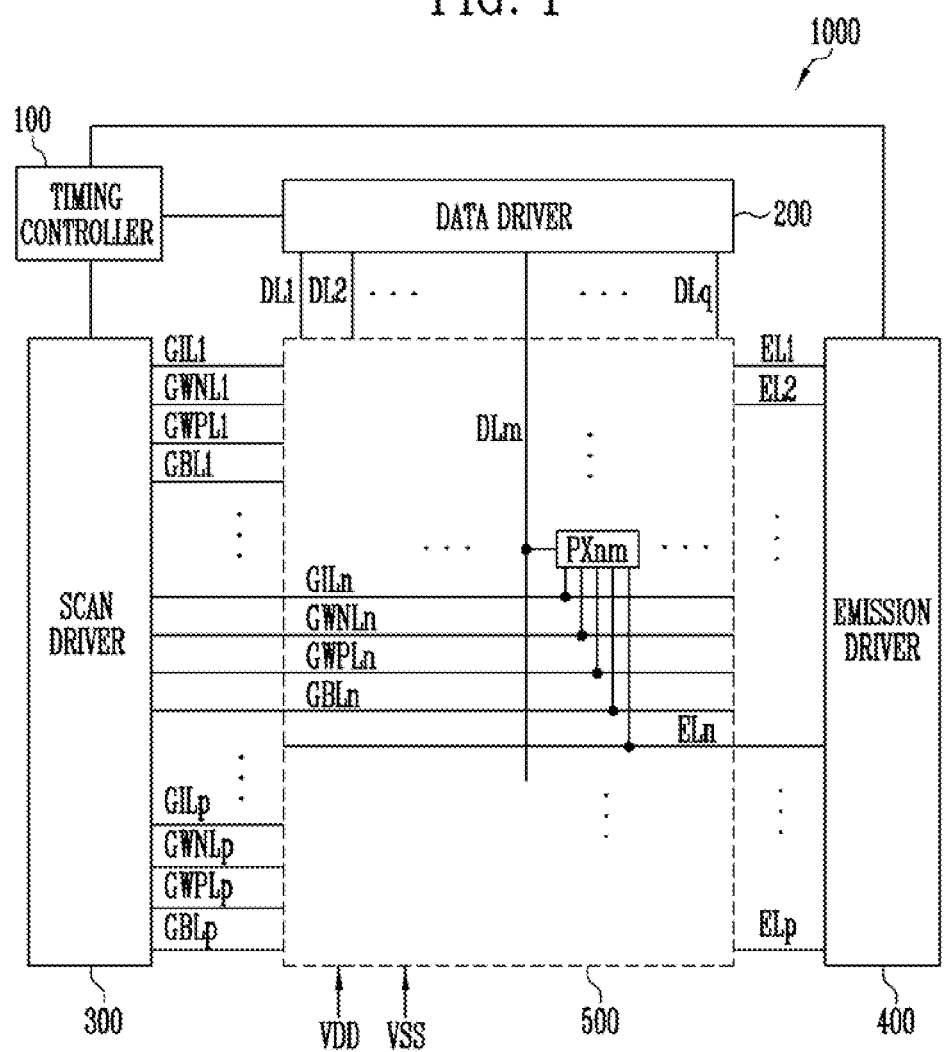
FIG. 1 is a block diagram illustrating a display device in accordance with exemplary embodiments of the present inventive concept.

Hereinafter, exemplary embodiments of the inventive concept will be described in detail with reference to the accompanying drawings. It is to be understood, however, that the described embodiments may be modified in various different ways, and thus, should not be limited to the embodiments set forth herein.

Throughout the specification, like reference numerals may refer to like parts. The sizes of elements in the accompanying drawings may be exaggerated for clarity of illustration. In the present specification, the singular forms are intended to include the plural forms as well, unless the context clearly indicates otherwise.

It will be understood that when an element is referred to as being "coupled" to another element, it may be directly coupled to the element or coupled thereto with other elements interposed there between.

FIG. 1 is a block diagram illustrating a display device 1000 in accordance with exemplary embodiments of the present inventive concept.

Referring to FIG. 1, the display device 1000 may include a timing controller 100, a data driver 200, a scan driver 300, an emission driver 400, and a pixel component 500.

The timing controller 100 may receive an external input signal from an external processor. The external input signal may include a vertical synchronization signal, a horizontal synchronization signal, a data enable signal, red, green, blue (RGB) data signals, and so on.

The vertical synchronization signal may include a plurality of pulses and indicate that a previous frame period ends and a current frame period starts based on a time point at which each pulse occurs. In other words, the vertical synchronization signal may indicate start and end points of a frame period. A distance between adjacent pulses of the vertical synchronization signal may correspond to one frame period. The horizontal synchronization signal may include a plurality of pulses and indicate that a previous horizontal period ends and a new horizontal period starts based on a time point at which each pulse occurs. In other words, the horizontal synchronization signal may indicate start and end points of a horizontal period. A distance between adjacent pulses of the horizontal synchronization signal may correspond to one horizontal period. The data enable signal may have an enable level in specific horizontal periods and have a disable level in the other periods. When the data enable signal has an enable level, this indicates that RGB data signals are supplied in corresponding horizontal periods. The RGB data signals may be supplied on a pixel row basis in respective corresponding horizontal periods. The timing controller 100 may generate gray scale values based on the RGB data signals to correspond to specifications of the display device 1000. The timing controller 100 may generate control signals to be supplied to the data driver 200, the scan driver 300, and the emission driver 400 based on an external input signal to correspond to the specifications of the display device 1000.

The data driver 200 may generate data voltages to be provided to data lines DL1 to DLq using the gray scale values and the control signals that are received from the timing controller 100. For example, the data driver 200 may sample the gray scale values using a clock signal, and apply data voltages corresponding to the gray scale values to the data lines DL1 to DLq on a basis of a pixel row (for example, pixels coupled to the same scan line).

The scan driver 300 may receive a clock signal, a scan start signal, etc. from the timing controller 100 and generate scan signals to be provided to scan lines GIL1 to GILp, GWNL1 to GWNLp, GWPL1 to GWPLp, and GBL1 to GBLp. Here, p is a natural number.

The scan driver 300 may include a plurality of sub-scan drivers. For example, a first sub-scan driver may provide a first sub-scan signal to first sub-scan lines GWPL1 to GWPLp. A second sub-scan driver may provide a second sub-scan signal to second sub-scan lines GWNL1 to GWNLn. A third sub-scan driver may provide a third sub-scan signal to third sub-scan lines GIL1 to GILp. A fourth sub-scan driver may provide a fourth sub-scan signal to fourth sub-scan lines GBL1 to GBLp.

In an exemplary embodiment of the present inventive concept, each of the sub-scan drivers may include a plurality of stage circuits coupled to each other in the form of shift register.

In an exemplary embodiment of the present inventive concept, the first and second sub-scan drivers may be integrated with each other so that the first sub-scan signal can be provided to the first sub-scan lines GWPL1 to GWPLp and the second sub-scan signal can be provided to the second sub-scan lines GWNL1 to GWNLn. In other words, the first and second sub-scan drivers may be configured in the form of one shift register. Consequently, the configuration of the scan driver 300 may be simplified.

The first sub-scan signal to be provided to the first sub-scan lines GWPL1 to GWPLp may include pulses each having a low level (or a logic low level). The second sub-scan signal to be provided to the second sub-scan lines GWNL1 to GWNLp may include pulses each having a high level (or a logic high level).

For example, in the case where the first sub-scan signal having a low level pulse is supplied to a gate electrode of a P-type transistor, the P-type transistor may be turned on. When the gate electrode of the P-type transistor is supplied with a high level pulse, it may be turned off. The P-type transistor may be a P-type metal oxide semiconductor (PMOS) transistor. For example, the P-type transistor may include an active pattern including a semiconductor having polycrystalline silicon or single-crystal silicon and be formed through a low temperature poly-silicon (LTPS) process or the like.

In the case where the second sub-scan signal having a high level pulse is supplied to a gate electrode of an N-type transistor, the N-type transistor may be turned on. When the gate electrode of the N-type transistor is supplied with a low level pulse, it may be turned off. The N-type transistor may be an N-type metal oxide semiconductor (NMOS) transistor. For example, the N-type transistor may include an active pattern including an oxide semiconductor and be formed through an LTPS process or the like.

In an exemplary embodiment of the present inventive concept, the third sub-scan signal may be obtained by shifting the second sub-scan signal. The fourth sub-scan signal may be obtained by shifting the first sub-scan signal. Hence, the first sub-scan driver may output the first and fourth sub-scan signals, and the second sub-scan driver may output the second and third sub-scan signals.

The emission driver 400 may receive a clock signal, and an emission control start signal, etc. from the timing controller 100 and generate emission control signals to be provided to emission control lines EL1 to ELp. For example, the emission driver 400 may provide emission control signals each having a turn-off level pulse to the emission control lines EL1 to ELp. If an emission control signal having a turn-off level is supplied to a gate electrode of a transistor, the corresponding transistor may be turned off. For example, the turn-off level of the emission control signal may be a high level (or a logic high level).

For example, the emission driver 400 may be formed as a shift register and generate emission control signals by sequentially transmitting a turn-off level pulse of an emission control signal to a subsequent emission stage under control of the clock signal.

The pixel component 500 includes pixels PXnm. For example, a pixel PXnm may be coupled to a corresponding data line DLm, corresponding scan lines GILn, GWNLn, GWPLn, and GBLn, and a corresponding emission line ELn. The pixel PXnm may emit or supply, to the outside, light having a predetermined luminance corresponding to a data voltage received through the corresponding data line DLm.

The pixels PXnm may be supplied with a first power supply voltage VDD and a second power supply voltage VSS. The first power supply voltage VDD and the second power supply voltage VSS may be power supply voltages used to drive the pixels PX.

The pixels PXnm may be electrically coupled with an initialization power supply line and thus be supplied with an initialization power supply voltage.

Figure 2:
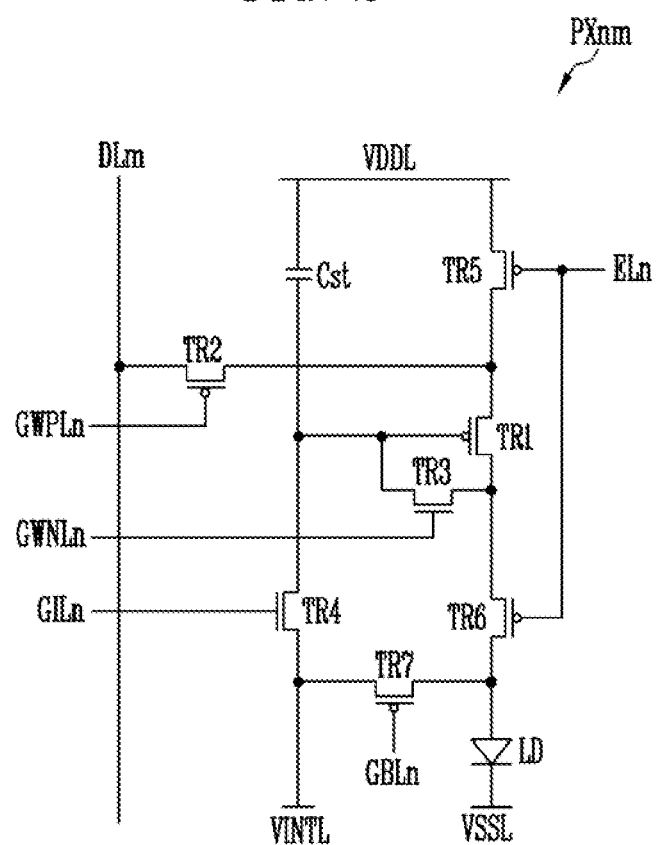
FIG. 2 is a circuit diagram illustrating a pixel included in the display device of FIG. 1 in accordance with an exemplary embodiment of the present inventive concept.

FIG. 2 is a circuit diagram illustrating a pixel PXnm included in the display device of FIG. 1 in accordance with an exemplary embodiment of the present inventive concept.

Referring to FIG. 2, the pixel PXnm may include transistors TR1, TR2, TR3, TR4, TR5, TR6, and TR7, a storage capacitor Cst, and a light emitting element LD.

The transistor TR1 may include a first electrode coupled to a first electrode of the transistor TR2, a second electrode coupled to a first electrode of the transistor TR3, and a gate electrode coupled to a second electrode of the transistor TR3. The transistor TR1 may be referred to as a driving transistor or a first transistor.

The transistor TR2 may include a first electrode coupled to the first electrode of the transistor TR1, a second electrode coupled to the data line DLm, and a gate electrode coupled to the first sub-scan line GWPLn. The transistor TR2 may be referred to as a scan transistor or a second transistor.

The transistor TR3 may include a first electrode coupled to the second electrode of the transistor TR1, a second electrode coupled to the gate electrode of the transistor TR1, and a gate electrode coupled to the second sub-scan line GWNLn. The transistor TR3 may be referred to as a diode connection transistor or a third transistor.

The transistor TR4 may include a first electrode coupled to a second electrode of the storage capacitor Cst, a second electrode coupled to an initialization power supply line VINTL, and a gate electrode coupled to the third sub-scan line GILn. The transistor TR4 may be referred to as a gate initialization transistor or a fourth transistor.

In an exemplary embodiment of the present inventive concept, the third sub-scan line GILn may be a second sub-scan line of a previous stage (e.g., an n–1-th second sub-scan line of the second sub-scan lines GWNL1 to GWNLp of FIG. 1).

The transistor TR5 may include a first electrode coupled to a first power supply voltage line VDDL, a second electrode coupled to the first electrode of the transistor TR1, and a gate electrode coupled to the emission line ELn. The second transistor TR5 may be referred to as a first emission transistor or a fifth transistor.

The transistor TR6 may include a first electrode coupled to the second electrode of the transistor TR1, a second electrode coupled to a first electrode of an emission element LD, and a gate electrode coupled to the emission line ELn. The transistor TR6 may be referred to as a second emission transistor or a sixth transistor.

The transistor TR7 may include a first electrode coupled to the first electrode of the emission element LD, a second electrode coupled to the initialization power supply line VINTL, and a gate electrode coupled to the fourth sub-scan line GBLn. The transistor TR7 may be referred to as an emission element initialization transistor or a seventh transistor.

In an exemplary embodiment of the present inventive concept, the fourth sub-scan line GBLn may be a first sub-scan line of a subsequent stage (e.g., an n+1-th first sub-scan line of the first sub-scan lines GWPL1 to GWPLp of FIG. 1).

The storage capacitor Cst may include a first electrode coupled to the first power supply voltage line VDDL and a second electrode coupled to the gate electrode of the transistor TR1.

The emission element LD may include a first electrode (e.g., an anode electrode) coupled to the second electrode of the transistor TR6, and a second electrode (e.g., a cathode electrode) coupled to a second power supply voltage line VSSL. A voltage to be applied to the second power supply voltage line VSSL may be lower than a voltage to be applied to the first power supply voltage line VDDL. The light emitting element LD may be an organic light emitting diode, an inorganic light emitting diode, a quantum dot light emitting diode, or the like.

Each of the transistors TR1, TR2, TR5, TR6, and TR7 may be a P-type transistor. Channels of the transistors TR1, TR2, TR5, TR6, and TR7 may be formed of poly-silicon. The poly-silicon transistor may be an LTPS transistor. The poly-silicon transistor may have high electron mobility and thus have high-speed driving characteristics.

Each of the transistors TR3 and TR4 may be an N-type transistor. Channels of the transistors TR3 and TR4 may be formed of oxide semiconductors. An oxide semiconductor transistor may be produced through a low-temperature process, and have low charge mobility compared to that of the poly-silicon transistor. Therefore, the amount of leakage current in oxide semiconductor transistors when in a turn-off state may be less than that of poly-silicon transistors.

In an exemplary embodiment of the present inventive concept, the transistor TR7 may be formed of an N-type oxide semiconductor transistor rather than a poly-silicon transistor. Here, one of the sub-scan lines GWNLn and GILn in lieu of the fourth sub-scan line GBLn may be coupled to the gate electrode of the transistor TR7.

In an exemplary embodiment of the present inventive concept, the transistor TR4 may be formed of a poly-silicon transistor rather than an N-type oxide semiconductor transistor. Here, one of the sub-scan lines GWPLn and GBLn in lieu of the third sub-scan line GILn may be coupled to the gate electrode of the transistor TR4.

Figure 3:
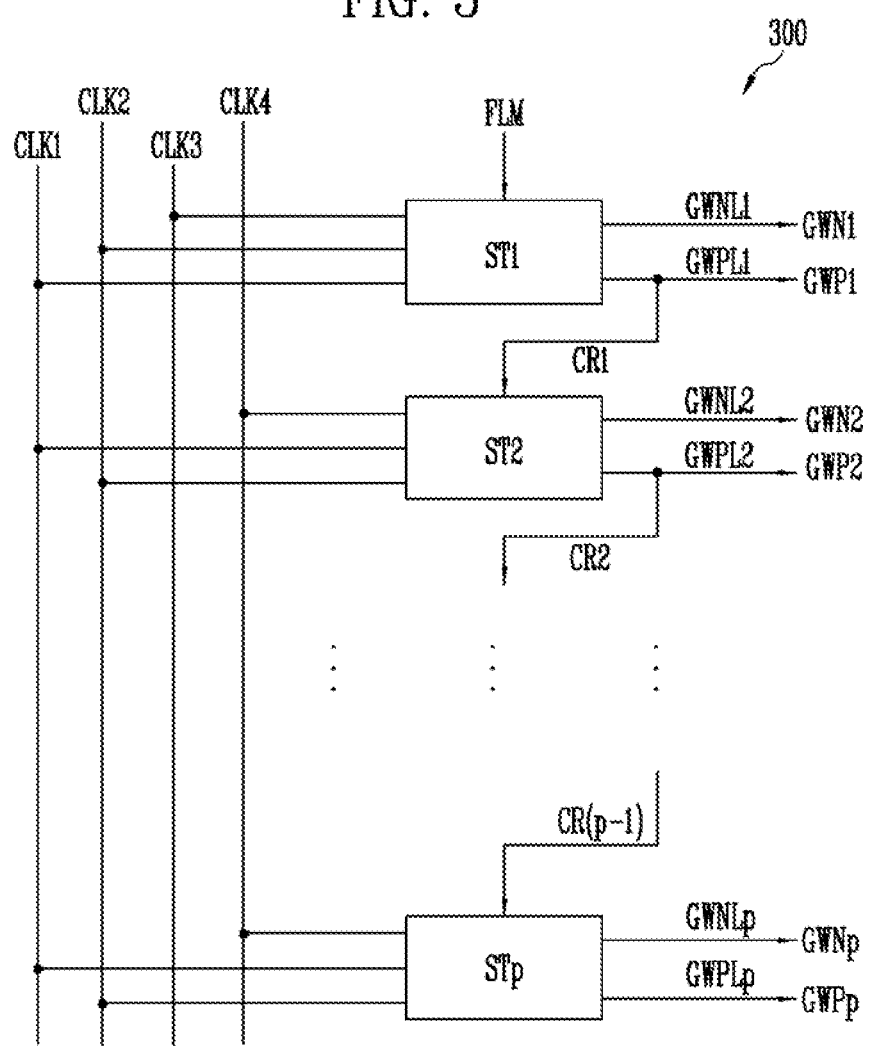
FIG. 3 is a block diagram illustrating a scan driver in accordance with exemplary embodiments of the present inventive concept.

FIG. 3 is a block diagram illustrating a scan driver 300 in accordance with exemplary embodiments of the present inventive concept.

Referring to FIG. 3, the scan driver 300 may include a plurality of stage circuits ST1 to STp (here, p is a natural number). FIG. 3 illustrates only a portion of the scan driver 300.

Each of the stage circuits ST1 to STp may be coupled to a corresponding clock line of first, second, third and fourth clock lines CLK1, CL2, CLK3 and CLK4.

In an exemplary embodiment of the inventive concept, each of the stage circuits ST1 to STp may be coupled to three clock lines of the first to fourth clock lines CLK1 to CLK4. For example, the stage circuit ST1 may be coupled to the first to third clock lines CLK1 to CLK3 and the stage circuit ST2 may be coupled to the first, second and fourth clock lines CLK1, CLK2 and CLK4. Here, all of the stage circuits ST1 to STp may be coupled to the first clock line CLK1 and the second clock line CLK2. Here, the stage circuits ST1 to STp may be alternately coupled to the third clock line CLK3 and the fourth clock line CLK4. For example, odd-numbered stage circuits may be coupled with the first clock line CLK1, the second clock line CLK2, and the third clock line CLK3. Even-numbered circuits may be coupled with the first clock line CLK1, the second clock line CLK2, and the fourth clock line CLK4.

It is to be understood that a connection relationship between the clock lines and the stage circuits is not limited to the foregoing. For example, the even-numbered stage circuits may be coupled with the first clock line CLK1, the second clock line CLK2, and the third clock line CLK3. The odd-numbered stage circuits may be coupled with the first clock line CLK1, the second clock line CLK2, and the fourth clock line CLK4.

Clock signals for the stage circuits ST1 to STp may be applied to the first to fourth clock lines CLK1 to CLK4. For example, a first clock signal may be applied to the first clock line CLK1. A second clock signal may be applied to the second clock line CLK2. A third clock signal may be applied to the third clock line CLK3. A fourth clock signal may be applied to the fourth clock line CLK4. The first to fourth clock signals will be described with reference to FIGS. 6 and 7.

The stage circuits ST1 to STp may be coupled with corresponding lines among the sub-scan lines GWPL1 to GWPLp and GWNL1 to GWNLp and carry lines CR1 to CR(p-1).

For example, the first stage circuit ST1 may be coupled to the first sub-scan line GWPL1, the second sub-scan line GWNL1, and the carry line CR1. The second stage circuit ST2 may be coupled to the first sub-scan line GWPL2, the second sub-scan line GWNL2, and the carry line CR2. The p-th stage circuit STp may be coupled to the first sub-scan line GWPLp, the second sub-scan line GWNLp, and the carry line CR(p-1).

The stage circuits ST1 to STp may respectively provide first sub-scan signals GWP1 to GWPp to the first sub-scan lines GWPL1 to GWPLp, respectively provide the second sub-scan signals GWN1 to GWNp to the second sub-scan lines GWNL1 to GWNLp, and respectively provide carry signals to the carry lines CR1 to CR(p-1).

In an exemplary embodiment of the present inventive concept, a first sub-scan signal and a carry signal that are provided from one stage circuit may be the same as each other. For example, a first sub-scan signal GWP1 to be provided from the first stage circuit ST1 to the first sub scan line GWP1 may be the same as a carry signal to be provided from the first stage circuit ST1 to the carry line CR1.

The stage circuits ST1 to STp may be coupled to an input line and be supplied with any one input signal of a scan start signal and a previous carry signal through the input line. The input line may include a scan start line FLM for providing the scan start signal and the carry lines CR1 to CR(p-1).

For example, the first stage circuit ST1 may be coupled to the scan start line FLM and be supplied with the scan start signal. An r-th stage circuit (here, r is a natural number ranging from 2 to p) may be coupled to an r-1-th carry line and be supplied with an r-1-th carry signal.

In response to a scan start signal provided through the scan start line FLM, the scan driver 300 may sequentially provide the first sub-scan signals GWP1 to GWPp to the first sub-scan lines GWPL1 to GWPLp and sequentially provide the second sub-scan signals GWN1 to GWNp to the second sub-scan lines GWNL1 to GWNLp. In other words, a scan start signal to be applied to the first stage circuit ST1 may control a start timing of scan signals to be output from the scan driver 300. For example, in response to the scan start signal, the first stage circuit ST1 may provide the first sub-scan signal GWP1 to the first sub-scan line GWPL1 and provide the second sub-scan signal GWN1 to the second sub-scan line GWNL1. After the first stage circuit ST1 has provided the first and second sub-scan signals GWP1 and GWN1, the second stage circuit ST2 may provide, in response to a carry signal provided through the carry line CR1, the first sub-scan signal GWP2 to the first sub-scan line GWPL2 and provide the second sub-scan signal GWN2 to the second sub-scan line GWNL2.

Likewise, in response to a carry signal provided through the carry line CR(p-1), the p-th stage circuit STp may provide the first sub-scan signal GWPp to the first sub-scan line GWPLp and provide the second sub-scan signal GWNp to the second sub-scan line GWNLp.

Figure 4:
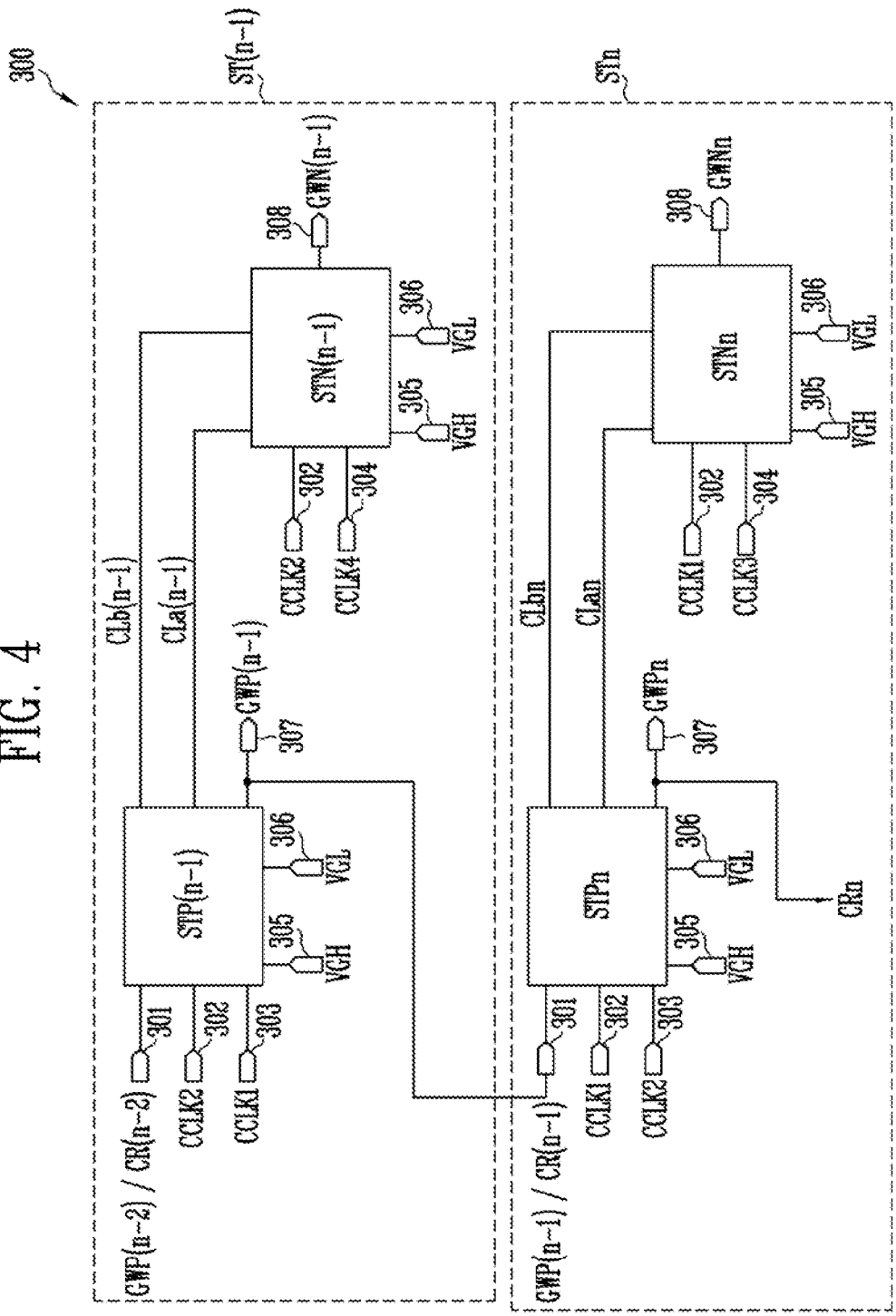
FIG. 4 is a diagram illustrating a stage circuit included in the scan driver of FIG. 3 and connection terminals of the stage circuit in accordance with an exemplary embodiment of the present inventive concept.

FIG. 4 is a diagram illustrating the stage circuit included in the scan driver of FIG. 3 and connection terminals of the stage circuit in accordance with an exemplary embodiment of the present inventive concept. For the sake of convenience, FIG. 4 illustrates only an n-1-th stage circuit ST(n-1) (here, n is a natural number greater than 2 and less than p) and an n-th stage circuit STn. Here, the n-1-th stage circuit ST(n-1) may be an even-numbered (or, an odd-numbered) stage circuit, and the n-th stage circuit STn may be an odd-numbered (or an even-numbered) stage circuit. Hereinafter, the description will be focused on the n-th stage circuit STn; however, the description for the n-1-th stage circuit ST(n-1) may be substantially equal or similar to the n-th stage circuit STn.

Referring to FIG. 4, the stage circuit ST(n-1), STn may include a first sub-stage circuit STP(n-1), STPn and a second sub-stage circuit STN(n-1), STNn. Furthermore, the stage circuit ST(n-1), STn may include a first input terminal 301, a second input terminal 302, a third input terminal 303, a fourth input terminal 304, a first power supply input terminal 305, a second power supply input terminal 306, a first output terminal 307, and a second output terminal 308.

The first sub-stage circuit STP(n-1), STPn may include a first input terminal 301, a second input terminal 302, a third input terminal 303, a first power supply input terminal 305, a second power supply input terminal 306, and a first output terminal 307.

The second sub-stage circuit STN(n−1), STNn may include a second input terminal 302, a fourth input terminal 304, a first power supply input terminal 305, a second power supply input terminal 306, and a second output terminal 308.

A carry signal CR(n−2) (or a first sub-scan signal GWP(n−2)) may be supplied from a previous first sub-stage circuit to the first input terminal 301 of the first sub-stage circuit STP(n−1). For example, in the case where the first sub-stage circuit STP(n−1) is a first stage circuit (ST1 of FIG. 3), a scan start signal may be supplied to the first input terminal 301 through the scan start line FLM.

The carry signal CR(n−1) (or the first sub-scan signal GWP(n−1)) may be supplied from a previous first sub-stage circuit STP(n−1) to the first input terminal 301 of the first sub-stage circuit STPn disposed in a subsequent stage.

Either a first clock signal CCLK1 or a second clock signal CCLK2 may be supplied to the second input terminal 302. For example, the first clock signal CCLK1 may be supplied to the second input terminal 302 of the n-th stage circuit STn. In this case, the second clock signal CCLK2 may be supplied to the second input terminal 302 of the n−1-th stage circuit ST(n−1). The second clock signal CCLK2 may be supplied to the second input terminal 302 of the first sub-stage circuit STP(n−1).

Except the clock signal supplied to the second input terminal 302, the other one of the first clock signal CCLK1 and the second clock signal CCLK2 may be supplied to the third input terminal 303. For example, if the first clock signal CCLK1 is supplied to the second input terminal 302 of the n-th stage circuit STn, the second clock signal CCLK2 may be supplied to the third input terminal 303 of the n-th stage circuit STn. In this case, the first clock signal CCLK1 may be supplied to the third input terminal 303 of the n−1-th stage circuit ST(n−1).

Either a third clock signal CCLK3 or a fourth clock signal CCLK4 may be supplied to the fourth input terminal 304. For example, the third clock signal CCLK3 may be supplied to the fourth input terminal 304 of the n-th stage circuit STn. In this case, the fourth clock signal CCLK4 may be supplied to the fourth input terminal 304 of the n−1-th stage circuit ST(n−1).

The first power supply input terminal 305 may be coupled to a first power supply VGH, and the second power supply input terminal 306 is coupled to a second power supply VGL. The voltage level of the first power supply VGH may be greater than the voltage level of the second power supply VGL. The first power supply VGH may supply a voltage having a high level, and the second power supply VGL may supply a voltage having a low level.

For example, in the case where the stage circuits STn and ST(n−1) of the scan driver (300 of FIG. 3) include P-type transistors, the voltage of the first power supply VGH may be set to a gate-off voltage, and the voltage of the second power supply VGL may be set to a gate-on voltage.

In an exemplary embodiment of the present inventive concept, the high level of each of the first to fourth clock signals CCLK1 to CCLK4 may be set to a gate-off voltage (e.g., the voltage of the first power supply VGH), and the low level of each of the first to fourth clock signals CCLK1 to CCLK4 may be set to a gate-on voltage (e.g., the voltage of the second power supply VGL). However, this is only for illustrative purposes, and the levels of the first to fourth clock signals CCLK1 to CCLK4 may be set in a manner different from the foregoing.

The first sub-stage circuit STPn may output a first sub-scan signal GWPn (or a first scan signal) to the first output terminal 307. The first sub-scan signal GWPn output to the first output terminal 307 may be supplied to an n-th first sub-scan line GWPLn (or a first scan line). The first sub-scan signal GWPn may have a pulse of a low level (or a logic low level).

The first sub stage circuit STPn may output the first sub-scan signal GWPn through the first output terminal 307 and provide the first sub-scan signal GWPn as a carry signal CRn to a first sub-stage circuit of a subsequent stage.

The second sub-stage circuit STNn may output a second sub-scan signal GWNn (or a second scan signal) to the second output terminal 308. The second sub-scan signal GWNn output to the second output terminal 308 may be supplied to an n-th second sub-scan line GWNLn (or a second scan line). The second sub-scan signal GWNn may have a pulse of a high level (or a logic high level).

The second sub-stage circuit STNn may not include a first input terminal 301. The second sub-stage circuit STNn may not receive a carry signal from the stage circuit of the previous stage circuit (e.g., the n−1-th first sub-stage circuit STP(n−1) or the n−1-th second sub-stage circuit STN(n−1)).

The first sub-stage circuit STPn may include first, second and third nodes and control the voltage of the first node, the voltage of the second node, and the voltage of the third node based on signals supplied through the first to third input terminals 301, 302, and 303 and power supplied through the first and second power supply input terminals 305 and 306.

The first sub-stage circuit STPn may output the first sub-scan signal GWPn to the first output terminal 307 based on the voltage of the first node, the voltage of the second node, and the voltage of the third node.

In an exemplary embodiment of the present inventive concept, the second sub-stage circuit STN(n−1), STNn may be coupled with the first sub-stage circuit STP(n−1), STPn through a first connection line CLa(n−1), CLan and a second connection line CLb(n−1), CLbn. Here, the first connection line CLa(n−1), CLan may be coupled to the first node. The second connection line CLb(n−1), CLbn may be coupled to the second node.

The second sub-stage circuit STNn may output the second sub-scan signal GWNn to the second output terminal 308 based on the voltage of the first node and the voltage of the second node.

Figure 5:
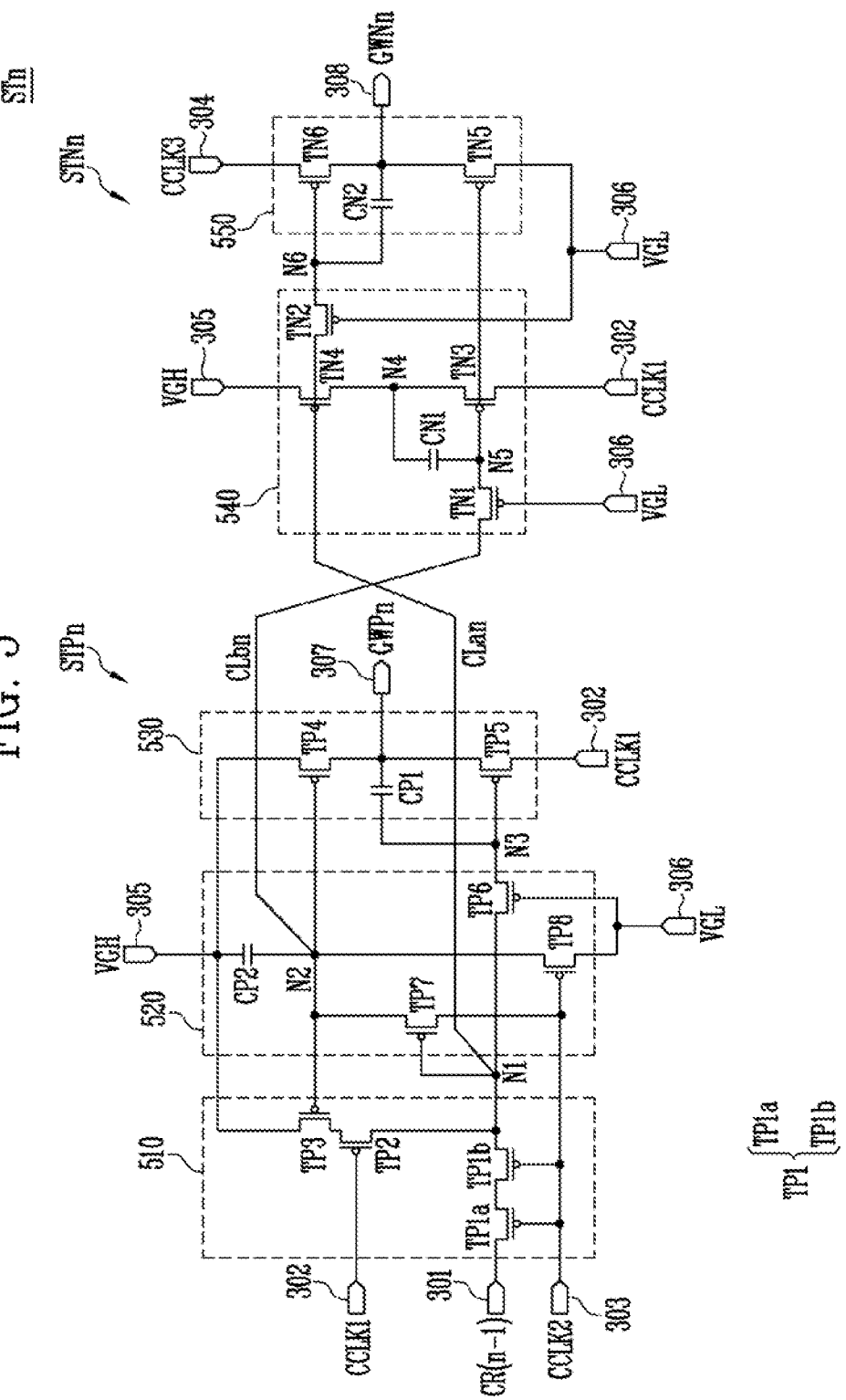
FIG. 5 is a circuit diagram illustrating a stage circuit included in the scan driver of FIG. 3 according to an exemplary embodiment of the present inventive concept.

FIG. 5 is a circuit diagram illustrating the stage circuit included in the scan driver of FIG. 3, according to an exemplary embodiment of the present inventive concept.

Hereinafter, for the sake of description, it is assumed that supply of the first clock signal CCLK1 and the second clock signal CCLK2 refers to supply of a gate-on voltage (e.g., a voltage having a low level), and non-supply of the first clock signal CCLK1 and the second clock signal CCLK2 refers to supply of a gate-off voltage (e.g., a voltage having a high level). In addition, it is assumed that that supply of the third clock signal CCLK3 and the fourth clock signal CCLK4 refers to supply of a gate-off voltage (e.g., a voltage having a high level), and non-supply of the third clock signal CCLK3 and the fourth clock signal CCLK4 refers to supply of a gate-on voltage (e.g., a voltage having a low level).

Referring to FIG. 5, the stage circuit STn may include a first sub-stage circuit STPn and a second sub-stage circuit STNn.

The first sub-stage circuit STPn may include a first driver 510, a second driver 520, and a first output component 530.

The first sub-stage circuit STPn may include first, second, third, fourth, fifth, sixth, seventh and eighth transistors TP1, TP2, TP3, TP4, TP5, TP6, TP7 and TP8 and first and second capacitors CP1 and CP2. Although in the following description it will be assumed that the transistors TP1 to TP8 are P-type transistors (e.g., PMOS transistors), those skilled in this art will understand that the stage circuit may be configured by replacing all or some of the transistors TP1 to TP8 with N-type transistors (e.g., NMOS transistors).

The first sub-stage circuit STPn may be coupled with the first input terminal 301, the second input terminal 302, the third input terminal 303, the first power supply input terminal 305, and the second power supply input terminal 306, and output a first sub-scan signal GWPn through the first output terminal 307.

The first driver 510 may include first, second and third transistors TP1, TP2, and TP3 and be coupled with the first to third input terminals 301, 302, and 303, and the first power supply input terminal 305. The first driver 510 may control the voltage of a first node N1, based on signals supplied through the first to third input terminals 301, 302, and 303 and the first power supply voltage VGH supplied from the first power supply input terminal 305.

The first transistor TP1 may include a first electrode coupled to the first input terminal 301, a second electrode coupled to the first node N1, and a gate electrode coupled to the third input terminal 303. The first transistor TP1 may control a connection between the first input terminal 301 and the first node N1 based on the second clock signal CCLK2 supplied through the third input terminal 303.

In an exemplary embodiment of the present inventive concept, the first transistor TP1 may include a first sub-transistor TP1a and a second sub-transistor TP1b which are coupled in series to each other. The first sub-transistor TP1a may include a first electrode coupled to the first input terminal 301, a second electrode coupled to a first electrode of the second sub-transistor TP1b, and a gate electrode coupled to the third input terminal 303. The second sub-transistor TP1b may include a first electrode coupled to the second electrode of the first sub-transistor TP1a, a second electrode coupled to the first node N1, and a gate electrode coupled to the third input terminal 303.

The second transistor TP2 may include a first electrode coupled to the first node N1, a second electrode coupled to a second electrode of the third transistor TP3, and a gate electrode coupled to the second input terminal 302. The second transistor TP2 may control a connection between the third transistor TP3 and the first node N1 based on the first clock signal CCLK1 supplied through the second input terminal 302.

The third transistor TP3 may include a first electrode coupled to the first power supply input terminal 305, the second electrode coupled to the second electrode of the second transistor TP2, and a gate electrode coupled to the second node N2. The third transistor TP3 may control a connection between the second transistor TP2 and the first power supply input terminal 305 based on the voltage of the second node N2.

Therefore, the second and third transistors TP2 and TP3 may control a timing at which the first power supply voltage VGH is supplied to the first node N1.

The second driver 520 may include sixth, seventh and eighth transistors TP6, TP7, and TP8, and a second capacitor CP2. The second driver 520 may be coupled with the first and second power supply input terminals 305 and 306 and the third input terminal 303. The second driver 520 may control the voltages of the second and third nodes N2 and N3 based on a signal supplied through the third input terminal 303, the second power supply voltage VGL supplied from the second power supply input terminal 306, and the voltage of the first node N1.

The sixth transistor TP6 may include a first electrode coupled to the first node N1, a second electrode coupled to the third node N3, and a gate electrode coupled to the second power supply input terminal 306. The gate electrode of the sixth transistor TP6 is coupled with the second power supply VGL through the second power supply input terminal 306. Hence, the sixth transistor TP6 when in a turn-on state may maintain an electrical connection between the first node N1 and the third node N3.

In an exemplary embodiment of the present inventive concept, the sixth transistor TP6 may limit a voltage drop width of the first node N1 based on the voltage of the third node N3. For example, in the case where the voltage of the third node N3 is reduced to a value lower than the second power supply voltage VGL due to coupling of the first capacitor CP1, the voltage of the first node N1 may not be reduced to a value lower than a voltage obtained by subtracting the threshold voltage of the sixth transistor TP6 from the second power supply voltage VGL. Hence, since the voltage of the first node N1 remains, an excessively high bias voltage may be prevented from being applied to the transistors coupled with the first node N1. Consequently, the reliability of the stage circuit STPn may be increased.

The seventh transistor TP7 may include a first electrode coupled to the third input terminal 303, a second electrode coupled to the second node N2, and a gate electrode coupled to the first node N1. The seventh transistor TP7 may control a connection between the second node N2 and the third input terminal 303 based on the voltage of the first node N1.

The eighth transistor TP8 may include a first electrode coupled to the second power supply input terminal 306, a second electrode coupled to the second node N2, and a gate electrode coupled to the third input terminal 303. The eighth transistor TP8 may control a connection between the second node N2 and the second power supply input terminal 306 based on the second clock signal CCLK2 supplied through the third input terminal 303.

The second capacitor CP2 may include a first electrode coupled to the first power supply input terminal 305, and a second electrode coupled to the second node N2. The second capacitor CP2 may store a voltage to be applied to the second node N2.

The first output component 230 may include fourth and fifth transistors TP4 and TP5 and a first capacitor CP1. The first output component 230 may be coupled with the second input terminal 302, the first power supply input terminal 305, the first output terminal 307, the second node N2, and the third node N3. The first output component 530 may control a voltage to be supplied to the first output terminal 307 based on the voltages of the second and third nodes N2 and N3. For example, the first output component 530 may electrically connect the second input terminal 302 or the first power supply input terminal 305 with the first output terminal 307 based on the voltages of the second and third nodes N2 and N3.

The fourth transistor TP4 may include a first electrode coupled to the first power supply input terminal 305, a second electrode coupled to the first output terminal 307, and a gate electrode coupled to the second node N2. The fourth transistor TP4 may control a connection between the first power supply input terminal 305 and the first output terminal 307 based on the voltage of the second node N2.

The fifth transistor TP5 may include a first electrode coupled to the second input terminal 302, a second electrode coupled to the first output terminal 307, and a gate electrode coupled to the third node N3. The fifth transistor TP5 may control a connection between the first output terminal 307 and the second input terminal 302 based on the voltage of the third node N3. The first output component 530 may be operated as an output buffer functioning as a pull-down buffer and a pull-up buffer.

The first capacitor CP1 may include a first electrode coupled to the third node, and a second electrode coupled to the first output terminal 307. The first capacitor CP1 may store voltages corresponding to a turn-on level and a turn-off level of the fifth transistor TP5.

In an exemplary embodiment of the present inventive concept, the first sub-stage circuit STPn is coupled to the first input terminal 301 to which an input signal CR(n−1) is supplied, a second input terminal 302 to which a first clock signal CCLK1 is supplied, and a third input terminal 303 to which a second clock signal CCLK2 is supplied. The first sub-stage circuit STPn is configured to control a voltage of the first node N1, a voltage of the second node N2, and a voltage of the third node N3 based on the input signal CR(n−1), the first clock signal CCLK1, and the second clock signal CCLK2, and supply a first scan signal GWPn to a first output terminal 307 based on the voltage of the second node N2 and the voltage of the third node N3.

The second sub-stage circuit STNn may include a third driver 540 and a second output component 550.

The second sub-stage circuit STNn may include ninth, tenth, eleventh, twelfth, thirteenth and fourteenth transistors TN1, TN2, TN3, TN4, TN5 and TN6 and third and fourth capacitors CN1 and CN2. Although in the following description it will be assumed that the transistors TN1 to TN6 are P-type transistors (e.g., PMOS transistors), those skilled in this art will understand that the stage circuit may be configured by replacing all or some of the transistors TN1 to TN6 with N-type transistors (e.g., NMOS transistors).

The second sub-stage circuit STNn may be coupled with the second input terminal 302, the fourth input terminal 304, the first power supply input terminal 305, and the second power supply input terminal 306. The second sub-stage circuit STNn may output a second sub-scan signal GWNn through the second output terminal 308.

In an exemplary embodiment of the inventive concept, the second sub-stage circuit STNn may be coupled with the first sub-stage circuit STPn through a first connection line CLan and a second connection line CLbn. Here, the first connection line CLan may be coupled to the first node N1 and the third driver 540, and the second connection line CLbn may be coupled to the second node N2 and the third driver 540. In other words, the first sub-stage circuit STPn and the second sub-stage circuit STNn may share the first node N1 and the second node N2.

The third driver 540 may be coupled with the first node N1 through the first connection line CLan and supplied with the voltage of the first node N1. In addition, the third driver 540 may be coupled with the second node N2 through the second connection line CLbn and supplied with the voltage of the second node N2. For example, each of the first and second nodes N1 and N2 may be directly connected to the third driver 540. However, the connection structure between the third driver 540 and the first and second nodes N1 and N2 is not limited to the foregoing. Other elements such as a transistor and a capacitor may be further provided between the third driver 540 and the first node N1 or the second node N2.

The third driver 540 may include ninth, tenth, eleventh and twelfth transistors TN1, TN2, TN3, and TN4, and a third capacitor CN1. The third driver 540 may be coupled with the second input terminal 302, the first power supply input terminal 305, and the second power supply input terminal 306. The third driver 540 may control the voltages of fourth, fifth and sixth nodes N4, N5, and N6, based on a first clock signal CCLK1 supplied through the second input terminal 302, first and second power supply voltages VGH and VGL supplied from the first and second power supply input terminals 305, the voltage of the first node N1, and the voltage of the second node N2.

The ninth transistor TN1 may include a first electrode coupled with the second node N2 through the second connection line CLbn, a second electrode coupled with a fifth node N5 (or a gate electrode of an eleventh transistor TN3), and a gate electrode coupled to the second power supply input terminal 306. The gate electrode of the ninth transistor TN1 may be coupled with the second power supply VGL through the second power supply input terminal 306. Hence, the ninth transistor TN1 when in a turn-on state may maintain an electrical connection between the second node N2 and the eleventh transistor TN3 through the second connection line CLbn. In other words, the second node N1 and the fifth node N5 may be electrically connected to each other by the ninth transistor TN1.

The ninth transistor TN1 may limit a drop width of a voltage corresponding to the first electrode of the ninth transistor TN1 based on the voltage of the fifth node N5. In other words, in the case when the voltage of the fifth node N5 is reduced to a value lower than the second power supply voltage VGL due to coupling of the third capacitor CN1, the voltage corresponding to the first electrode of the ninth transistor TN1 may not be reduced to a value lower than a voltage obtained by subtracting the threshold voltage of the ninth transistor TN1 from the second power supply voltage VGL. Therefore, since the voltage corresponding to the first electrode of the ninth transistor TN1 is maintained, an excessively high bias voltage may be prevented from being applied to the transistors coupled to the first electrode (or the second node N2) of the ninth transistor TN1. Consequently, the reliability of the stage circuit STn may be increased.

The tenth transistor TN2 may include a first electrode coupled with the first node N1 (or a gate electrode of the twelfth transistor TN4) through the first connection line CLan, a second electrode coupled with a sixth node N6, and a gate electrode coupled to the second power supply input terminal 306. The gate electrode of the tenth transistor TN2 may be coupled with the second power supply VGL through the second power supply input terminal 306. Hence, the tenth transistor TN2 when in a turn-on state may maintain an electrical connection between the first node N1 and the sixth node N6 through the first connection line CLan. In other words, the first node N1 and the sixth node N6 may be electrically connected to each other by the tenth transistor TN2.

In an exemplary embodiment of the present inventive concept, the tenth transistor TN2 may limit a drop width of a voltage corresponding to the first electrode of the tenth transistor TN2 (or a gate electrode of the twelfth transistor TN4) based on the voltage of the sixth node N6. In other words, in the case where the voltage of the sixth node N6 is reduced to a value lower than the second power supply voltage VGL due to coupling of the fourth capacitor CN2, the voltage corresponding to the first electrode of the tenth transistor TN2 may not be reduced to a value lower than a voltage obtained by subtracting the threshold voltage of the tenth transistor TN2 from the second power supply voltage VGL. Therefore, since the voltage corresponding to the first electrode of the tenth transistor TN2 is maintained, an excessively high bias voltage may be prevented from being applied to the transistors coupled to the first electrode (or the first node N1) of the tenth transistor TN2. Consequently, the reliability of the stage circuit STn may be increased.

The eleventh transistor TN3 may include a first electrode coupled to the second input terminal 302, a second electrode coupled to the fourth node N4, and a gate electrode coupled to the fifth node N5 (or the second electrode of the ninth transistor TN1). The eleventh transistor TN3 may be turned on or off based on the voltage of the fifth node N5 to control an electrical connection between the fourth node N4 and the second input terminal 302.

The twelfth transistor TN4 may include a first electrode coupled to the first power supply input terminal 305, a second electrode coupled to the fourth node N4, and a gate electrode coupled to the first node N1 through the first connection line CLan. The twelfth transistor TN4 may be turned on or off based on the voltage of the first node N1 to control an electrical connection between the first power supply input terminal 305 and the fourth node N4.

The third capacitor CN1 may include a first electrode coupled to the fifth node N5, and a second electrode coupled to the fourth node N4. The third capacitor CN1 may store a voltage corresponding to the fifth node N5.

When the first node N1 is set to a voltage having a low level, the third driver 540 may supply the voltage of the first power supply VGH to the fourth node N4. If the voltage of the first power supply VGH is supplied to the fourth node N4, the voltage of the fifth node N5 may be stably maintained by the coupling of the third capacitor CN1.

The second output component 550 may include thirteenth and fourteenth transistors TN5 and TN6 and a fourth capacitor CN2 and be coupled with the fourth input terminal 304, the second power supply input terminal 306, the fifth node N5, and the sixth node N6. The second output component 550 may control a voltage to be supplied to the second output terminal 308 based on the voltages of the fifth and sixth nodes N5 and N6. For example, the second output component 550 may electrically connect the second power supply input terminal 306 or the fourth input terminal 304 with the second output terminal 308 based on the voltages of the fifth and sixth nodes N5 and N6.

The thirteenth transistor TN5 may include a first electrode coupled to the second power supply input terminal 306, a second electrode coupled to the second output terminal 308, and a gate electrode coupled to the fifth node N5. The thirteenth transistor TN5 may be turned on or off based on the voltage of the fifth node N5. The gate electrode of the thirteenth transistor TN5 may also be coupled to the gate electrode of the eleventh transistor TN3.

The fourteenth transistor TN6 may include a first electrode coupled to the fourth input terminal 304, a second electrode coupled to the second output terminal 308, and a gate electrode coupled to the sixth node N6. The fourteenth transistor TN6 may be turned on or off based on the voltage of the sixth node N6. Here, when the fourteenth transistor TN6 is turned on, the voltage (e.g., a voltage having a high level) of a third clock signal CCLK3 supplied to the fourth input terminal 304 may be output as the second sub-scan signal GWNn.

The fourth capacitor CN2 may include a first electrode coupled to the sixth node N6, and a second electrode coupled to the second output terminal 308. The fourth capacitor CN2 may store the voltage of the sixth node N6.

As illustrated in FIG. 5, the fourth input terminal 304 may not be coupled with a separate capacitor. Therefore, the load of the third clock signal CCLK3 that is supplied through the fourth input terminal 304 may be reduced.

In an exemplary embodiment of the present inventive concept, the second sub-stage circuit STNn is coupled to the second input terminal 302, a fourth input terminal 304 to which a third clock signal CCLK3 is supplied, the first node N1, and the second node N2. The second sub-stage circuit STNn is configured to supply a second scan signal GWNn different from the first scan signal GWPn to a second output terminal 308 based on the first clock signal CCLK1, the third clock signal CCLK3, the voltage of the first node N1, and the voltage of the second node N2.

Figure 6:
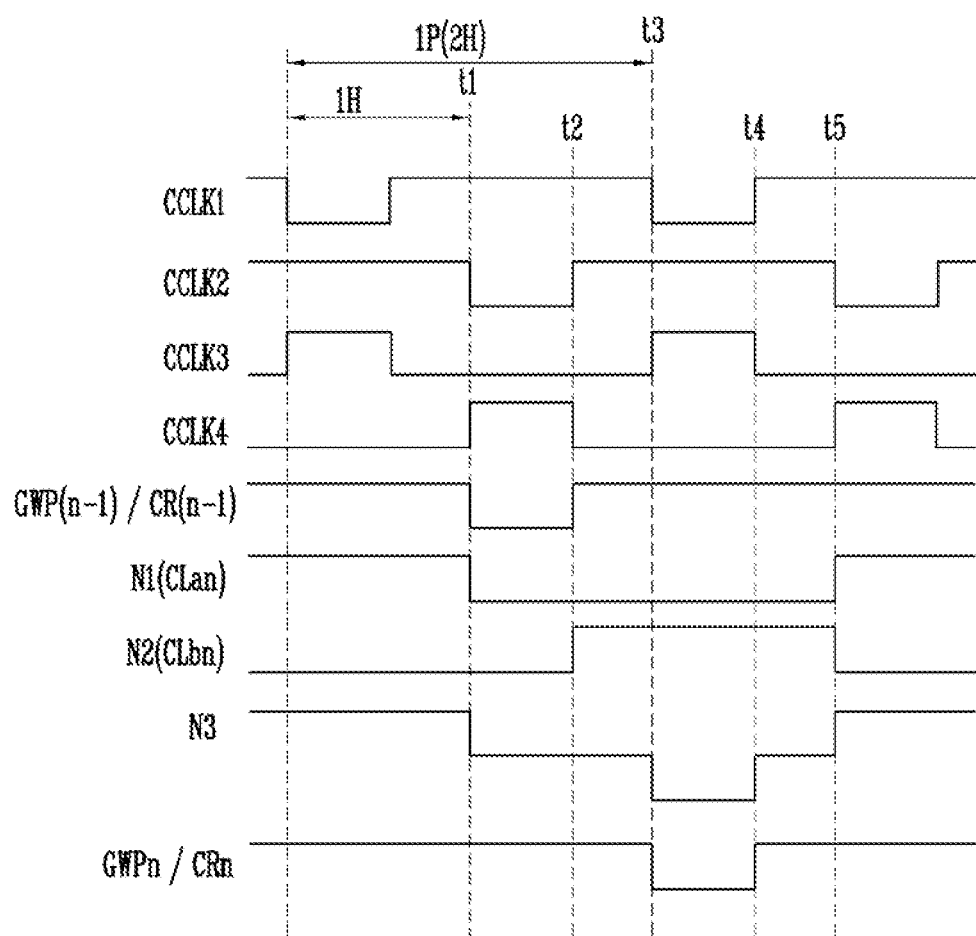

FIGS. 6 and 7 are waveform diagrams for describing an operation of the stage circuit of FIG. 5, according to an exemplary embodiment of the present inventive concept.

FIGS. 6 and 7 illustrate the first to fourth clock signals CCLK1 To CCLK4, the carry signal CR(n−1), the voltage of the first node N1, the voltage of the second node N2, the voltage of the third node N3, the voltage of the fourth node N4, the voltage of the fifth node N5, the voltage of the sixth node N6, the first sub-scan signal GWPn, and the second sub-scan signal GWNn.

Referring to FUGS. 6 and 7, the first sub-scan signal GWPn may be output based on the carry signal CR(n−1), the first clock signal CCLK1, and the second clock signal CCLK2. Furthermore, the second sub-scan signal GWNn may be output based on the voltage of the first node N1, the voltage of the second node N2, the first clock signal CCLK1, and the third clock signal CCLK3.

The first clock signal CCLK1 to the fourth clock signal CCLK4 each may have a square waveform pattern which is repeated between a high level and a low level, and may be set to have the same cycle 1P. Here, one cycle 1P may correspond to two horizontal periods 2H.

The first to fourth clock signals CCLK1 to CCLK4 each may be set such that the high level and the low level thereof have different widths during a period of the one cycle 1P. For example, the first clock signal CCLK1 and the second clock signal CCLK2 each may be set such that the low level has a width less than that of the high level. In other words, the first clock signal CCLK1 and the second clock signal CCLK2 each may have a pulse having a low level. In addition, the width of the high level pulse of the first clock signal CCLK1 may be larger than the width of the low level pulse of the first clock signal CCLK1. The third clock signal CCLK3 and the fourth clock signal CCLK4 each may be set such that the high level has a width less than that of the low level. In other words, the third clock signal CCLK3 and the fourth clock signal CCLK4 each may have a pulse having a high level. In addition, the width of the low level pulse of the fourth clock signal CCLK4 may be larger than the width of the high level pulse of the fourth clock signal CCLK4.

The second clock signal CCLK1 may be delayed with a phase difference of ½ cycle (or one horizontal period 1H) compared to the first clock signal CCLK1.

The third clock signal CCLK3 may be a signal obtained by inverting the first clock signal CCLK1. For example, when the first clock signal CCLK1 has a low level, the third clock signal CCLK3 may have a high level. When the first clock signal CCLK1 has a high level, the third clock signal CCLK3 may have a low level. The fourth clock signal CCLK4 may be a signal obtained by inverting the second clock signal CCLK2.

The waveforms of the first to fourth clock signals CCLK1 to CCLK4 are not limited to the foregoing. For example, the first to fourth clock signals CCLK1 to CCLK4 may be set to have various cycles and duty ratios.

Based on the second power supply VGL that supplies a voltage having a low level, the sixth transistor TP6 may remain in a turn-on state during most of the period. Unless otherwise noted, detailed description of the sixth transistor TP6 will hereinafter be omitted.

Referring to FIGS. 5 and 6, the first sub-stage circuit STPn may output the first sub-scan signal GWPn.

At a first time point t1, the second clock signal CCLK2 having the low level may be supplied through the third input terminal 303, and the carry signal CR(n−1) having the low level may be supplied through the first input terminal 301. In this case, the first sub-transistor TP1a and the second sub-transistor TP1b are turned on, so that the first node N1 may be discharged to the low level based on the carry signal CR(n−1) having the low level.

Furthermore, at the first time point t1, the first node N1 has a voltage having a low level, and the second clock signal CCLK2 having the low level is supplied through the third input terminal 303. Therefore, the seventh transistor TP7 and the eighth transistor TP8 may be turned on. Therefore, based on the second power supply VGL that supplies the second clock signal CCLK2 having the low level or a voltage having a low level, the second node N2 may be discharged to the low level or remain in the low level.

At the first time point t1, since the sixth transistor TP6 may remain in the turn-on state, the third node N3 may be discharged to the low level based on the second node N2 having the low level. Hence, the fifth transistor TP5 may be turned on.

At a second time point t2, the second clock signal CCLK2 having the high level may be supplied through the third input terminal 303. In this case, the first transistor TP1 and the eighth transistor TP8 may be turned off. For example, at the second time point t2, the second clock signal CCLK2 may transition from the low level to the high level to thereby turn off the first and eighth transistors TP1 and TP8.

Furthermore, at the second time point t2, the voltage of the first node N1 may remain in the low level, so that the seventh transistor TP7 may be turned on or maintained in the turn-on state. Therefore, since the voltage of the second node N2 is charged to the high level based on the second clock signal CCLK2 having the high level, the fourth transistor TP4 may be turned off depending on the voltage of the second node N2 having the high level.

At a third time point t3, the first clock signal CCLK1 having the low level may be supplied through the second input terminal 302. In other words, the first clocks signal CCLK1 may transition to the low level at the third time point t3. In this case, since the fifth transistor TP5 is in a turn-on state, the first clock signal CCLK1 having the low level may be supplied to the first output terminal 307. Hence, the first output terminal 307 may output the first clock signal CCLK1 as the first sub-scan signal GWPn having the turn-on level (e.g., the low level). In other words, the first sub-scan signal GWPn may transition to the low level at the third time point t3 like the first clock signal CCLK1.

In the case where the first clock signal CCLK1 having the low level is supplied to the first output terminal 307, the voltage of the third node N3 may be reduced to a voltage level lower than the voltage level of the second power supply VGL by the coupling of the first capacitor CP1. For example, at the third time point t3, the voltage of the third node N3 may drop even further below the low level it had at the second time point t2. Hence, the fifth transistor TP5 may be stably maintained in the turn-on state.

As described with reference to FIG. 5, in the case where the voltage level of the third node N3 is reduced, the voltage of the first node N1 may not be reduced by the sixth transistor TP6 to a value lower than a voltage obtained by subtracting the threshold voltage of the sixth transistor TP6 from the second power supply VGL.

At a fourth time point t4, the first clock signal CCLK1 having the high level may be supplied through the second input terminal 302. Hence, the first output terminal 307 may output the first clock signal CCLK1 as the first sub-scan signal GWPn having the turn-off level (e.g., the high level).

The voltage of the third node N3 may be increased to the voltage of the second power supply VGL based on the high level voltage of the first output terminal 307.

At a fifth time point t5, the second clock signal CCLK2 having the low level may be supplied through the third input terminal 303. In this case, the first sub-transistor TP1a and the second sub-transistor TP1b are turned on, so that the first node N1 may be charged to the high level based on the carry signal CR(n−1) having the high level.

Since the sixth transistor TP6 is maintained in the turn-on state, the third node N3 may be charged to the high level based on the voltage of the first node N1 having the high level. In this case, the fifth transistor TP5 may be turned off.

At a fifth time point t5, the eighth transistor TP8 may be turned on based on the second clock signal CCLK2 having the low level, so that the second node N2 may be discharged to the low level based on the voltage of the second power supply VGL having the low level. In this case, since the fourth transistor TP4 is turned on, the first output terminal 307 may be reliably supplied with the high level voltage of the first power supply VGH.

Referring to FIGS. 5 and 7, the second sub-stage circuit STNn may output the second sub-scan signal GWNn.

Based on the second power supply VGL that supplies a voltage having a low level, the ninth and tenth transistors TN1 and TN2 may be maintained in a turn-on state during most of the period. Unless otherwise noted, a detailed description of the ninth and tenth transistors TN1 and TN2 will hereinafter be omitted.

At a first time point t1, the first node N1 may be discharged to the low level. In this case, since the tenth transistor TN2 may be maintained in the turn-on state, the sixth node N6 may be discharged to the low level.

The second clock signal CCLK2 having the low level may be supplied through the third input terminal 303, and the carry signal CR(n−1) having the low level may be supplied through the first input terminal 301. In this case, the first sub-transistor TP1a and the second sub-transistor TP1b are turned on, so that the first node N1 may be discharged to the low level based on the carry signal CR(n−1) having the low level. Hence, the fourteenth transistor TN6 may be turned on.

Furthermore, at the first time point t1, since the first node N1 is discharged to the low level, the twelfth transistor TN4 may be turned on, so that the high level voltage of the first power supply VGH may be supplied to the fourth node N4. In this case, the voltage of the fifth node N5 may be stably maintained by the coupling of the third capacitor CN1.

At a second time point t2, the second node N2 may be transitioned to the high level. In this case, since the ninth transistor TN1 may be maintained in the turn-on state, the fifth node N5 may be transitioned to the high level. Thereby, the eleventh to thirteenth transistors TN3 and TN5 may be turned off.

At a third time point t3, the third clock signal CCLK3 having the high level may be supplied through the fourth input terminal 304. In this case, since the fourteenth transistor TN6 is in a turn-on state, the third clock signal CCLK3 having the high level may be supplied to the second output terminal 308. Hence, the second output terminal 308 may output the third clock signal CCLK3 as the second sub-scan signal GWNn having the turn-on level (e.g., the high level).

At a fourth time point t4, the third clock signal CCLK3 having the low level may be supplied through the fourth input terminal 304. Hence, the second output terminal 308 may output the third clock signal CCLK3 as the second sub-scan signal GWNn having the turn-off level (e.g., the low level).

In the case where the third clock signal CCLK3 having the low level is supplied to the second output terminal 308, the voltage of the sixth node N6 may be reduced to a voltage level lower than the voltage level of the second power supply VGL by the coupling of the fourth capacitor CN2. For example, between the fourth time point t4 and the fifth time point t5, the voltage of the sixth node N6 may be lower than it was at the third time point t3. Hence, the fourteenth transistor TN6 may be stably maintained in the turn-on state.

As described with reference to FIG. 5, in the case where the voltage level of the sixth node N6 is reduced, the voltage of the first node N1 may not be reduced by the tenth transistor TN2 to a value lower than a voltage obtained by subtracting the threshold voltage of the tenth transistor TN2 from the second power supply VGL.

At a fifth time point t5, the first node N1 may be charged to the high level, and the second node N2 may be discharged to the low level. In this case, the fifth node N5 may be discharged to the low level, and the sixth node N6 may be charged to the high level. Hence, the eleventh and thirteenth transistors TN3 and TN5 may be turned on, and the twelfth and fourteenth transistors TN4 and TN6 may be turned off.

Since the thirteenth transistor TN5 is turned off, the second output terminal 308 may be reliably supplied to the low level voltage of the second power supply VGL.

As described above, the second sub-stage circuit STNn may be coupled to the first node N1 and the second node N2 of the first sub-stage circuit STPn without receiving a carry signal. The second sub-stage circuit STNn may output the second sub-scan signal GWNn based on the voltages of the first and second nodes N1 and N2 that are shared with the first sub-stage circuit STPn. Therefore, the stage circuit STn may output the first sub-scan signal GWPn having the high level and the second sub-scan signal GWNn having the low level using only one shift register without a separate shift register. Consequently, a dead space of the display device may be reduced, and production cost of the display device may be reduced.

A stage circuit and a scan driver in accordance with exemplary embodiments of the present inventive concept described above may supply a scan signal having a high level and a scan signal having a low level using only one shift register. Consequently, dead space and production cost of a display device including the stage circuit and scan driver may be reduced.

While the present inventive concept has been described with reference to exemplary embodiments thereof, those skilled in the art will appreciate that various changes in form and details may be made thereto without departing from the spirit and scope of the present inventive concept as set forth in the following claims.

What is claimed is:

1. A display device, comprising:
    a pixel connected to a first scan line and a second scan line; and
    a scan driver comprising a stage circuit connected to the pixel through the first scan line and the second scan line, the stage circuit comprising:
        a first sub-stage circuit connected to a first input terminal and the first scan line, the first sub-stage circuit being configured to supply a first scan signal including a low level pulse to the first scan line in response to an input signal supplied to the first input terminal; and
        a second sub-stage circuit connected to a first node of the first sub-stage circuit, a second node of the first sub-stage circuit, and the second scan line, the second sub-stage circuit being configured to supply a second scan signal including a high level pulse to the second scan line in response to a voltage of the first node and a voltage of the second node,
    wherein the second sub-stage circuit comprises a first transistor connected between the second node and a third node and comprising a gate electrode connected to a second power input terminal, and a second transistor connected between the first node and a fourth node and comprising a gate electrode connected to the second power input terminal, and
    wherein the first transistor and the second transistor are configured to maintain a turn-on state in response to a second power voltage supplied to the second power input terminal.

2. The display device of claim 1, wherein the second sub-stage circuit further comprises:
    a third transistor connected between a second input terminal to which a first clock signal is supplied and a fifth node and comprising a gate electrode connected to the third node, the third transistor being configured to control an electrical connection between the second input terminal and the fifth node in response to a voltage of the third node;
    a fourth transistor connected between a first power input terminal to which a first power voltage is supplied and the fifth node and comprising a gate electrode connected to the first node, the fourth transistor being configured to control an electrical connection between the first power input terminal and the fifth node in response to the voltage of the first node; and
    a first capacitor connected between the fifth node and the third node.

3. The display device of claim 2, wherein the second sub-stage circuit further comprises:
    a fifth transistor connected between the second power input terminal and an output terminal of the second sub-stage circuit and comprising a gate electrode connected to the third node, the fifth transistor being configured to control an electrical connection between the second power input terminal and the output terminal in response to the voltage of the third node;
    a sixth transistor connected between a third input terminal to which a second clock signal is supplied and the output terminal and comprising a gate electrode connected to the fourth node, the sixth transistor being configured to control an electrical connection between the third input terminal and the output terminal in response to a voltage of the fourth node; and
    a second capacitor connected between the fourth node and the output terminal.

4. The display device of claim 3, wherein the second power voltage is lower than the first power voltage.

5. The display device of claim 1, wherein the stage circuit is configured to simultaneously supply the first scan signal and the second scan signal to the first scan line and the second scan line, respectively.

6. The display device of claim 1, wherein the first sub-stage circuit outputs the low level pulse of the first scan signal in response to the voltage of the first node, and outputs the first scan signal at a high level in response to the voltage of the second node.

7. The display device of claim 6, wherein the second sub-stage circuit outputs the high level pulse of the second scan signal in response to the voltage of the first node, and outputs the second scan signal at a low level in response to the voltage of the second node.

8. The display device of claim 1, further comprising a plurality of pixel rows including a pixel row in which the pixel is disposed, wherein each of the plurality of pixel rows comprises a plurality of pixels connected to a first scan line and a second scan line of a corresponding pixel row.

9. The display device of claim 8, wherein the scan driver further comprises a plurality of stage circuits including the stage circuit, and wherein the plurality of stage circuits are configured to sequentially supply the first scan signal to first scan lines of the plurality of pixel rows and sequentially supply the second scan signal to second scan lines of the plurality of pixel rows.

10. The display device of claim 1, wherein the input signal is a scan start signal supplied to the scan driver or a first scan signal from a first sub-stage circuit of a previous stage circuit of the scan driver.

11. The display device of claim 1, wherein the pixel comprises:
   a P-type transistor configured to be turned-on in response to the first scan signal; and
   an N-type transistor configured to be turned-on in response to the second scan signal.

12. The display device of claim 11, wherein the pixel further comprises:
   an emission element connected between a first power voltage line and a second power voltage line;
   a driving transistor connected between the first power voltage line and the emission element;
   a scan transistor as the P-type transistor connected between a data line and the driving transistor;
   a diode connection transistor as the N-type transistor connected between a first electrode of the driving transistor and a gate electrode of the driving transistor; and
   a storage capacitor connected between the first power voltage line and the gate electrode of the driving transistor.

* * * * *